United States Patent [19]

Akagawa et al.

[11] Patent Number: 5,000,651
[45] Date of Patent: Mar. 19, 1991

[54] DISK GRIPPER FOR USE WITH A DISK POLISHER

[75] Inventors: Minoru Akagawa, Fremont; Ryo Narisawa, Palo Alto; David Wilkinson, Dublin, all of Calif.

[73] Assignee: Intelmatic Corporation, Fremont, Calif.

[21] Appl. No.: 471,830

[22] Filed: Jan. 29, 1990

[51] Int. Cl.$^5$ .............................................. B25J 17/00
[52] U.S. Cl. ................................... 414/741; 294/86.4; 294/93; 901/28; 901/47
[58] Field of Search ............... 414/680, 729, 741, 908; 294/93, 86.4; 901/14, 28, 29, 35, 47, 49

[56] References Cited

U.S. PATENT DOCUMENTS

| 4,042,122 | 8/1977 | Espy et al. ................. | 414/741 X |
| 4,626,013 | 12/1986 | Barrows ..................... | 414/741 X |
| 4,629,385 | 12/1986 | Irie .......................... | 901/29 X |
| 4,655,674 | 4/1987 | Kohler et al. ............. | 901/29 X |

Primary Examiner—Frank E. Werner
Assistant Examiner—Donald W. Underwood
Attorney, Agent, or Firm—Flehr, Hohbach, Test, Albritton & Herbert

[57] ABSTRACT

A disk gripper has a rotary actuator with a horizontally supported shaft, a swing arm which is attached to and can rotate with this shaft and a finger arm which is connected to the swing arm such that the connected arms together extend radially from the shaft. Gripper fingers on the finger arm have mutually coplanar flat outer surfaces which point downward when the arms are in the horizontally extended position. The gripper fingers are provided with grooves and are movable toward or away from one another while their flat outer surfaces slidingly move over a horizontal support surface such that a disk lying on this surface can be engaged in these grooves or disengaged therefrom. The swing arm and the finger arm are slidable within a limited distance with respect to each other in a direction perpendicular to their extension. A spring applies a biasing force on the finger arm with respect to the swing arm such that, when the arms are in the horizontally extended position, the biasing force of the spring on the finger arm is in the downward direction.

10 Claims, 3 Drawing Sheets

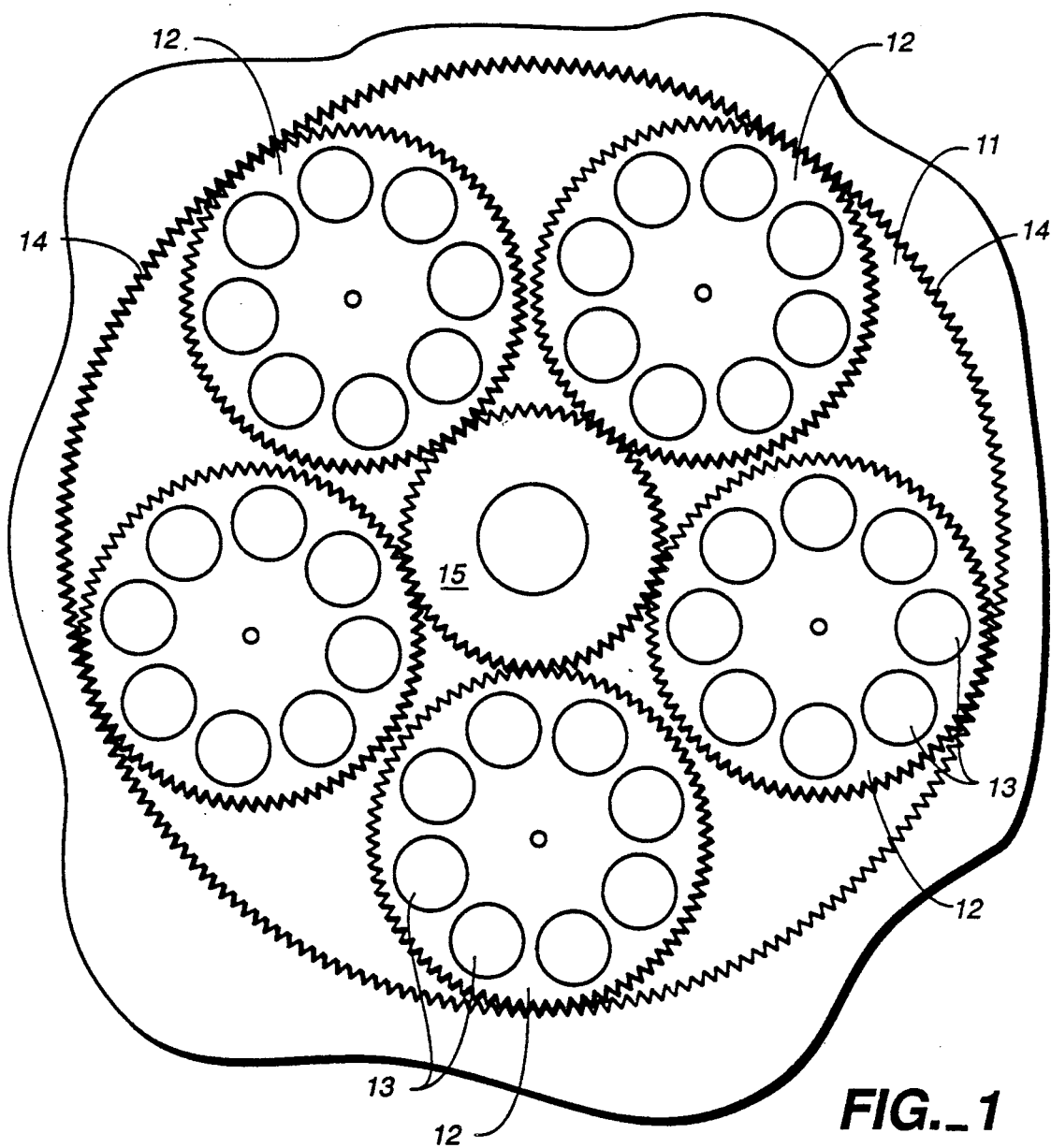
FIG._1
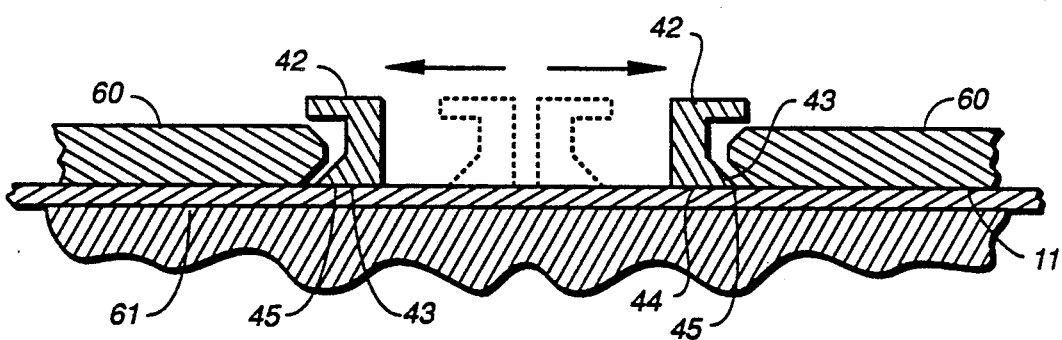
FIG._4

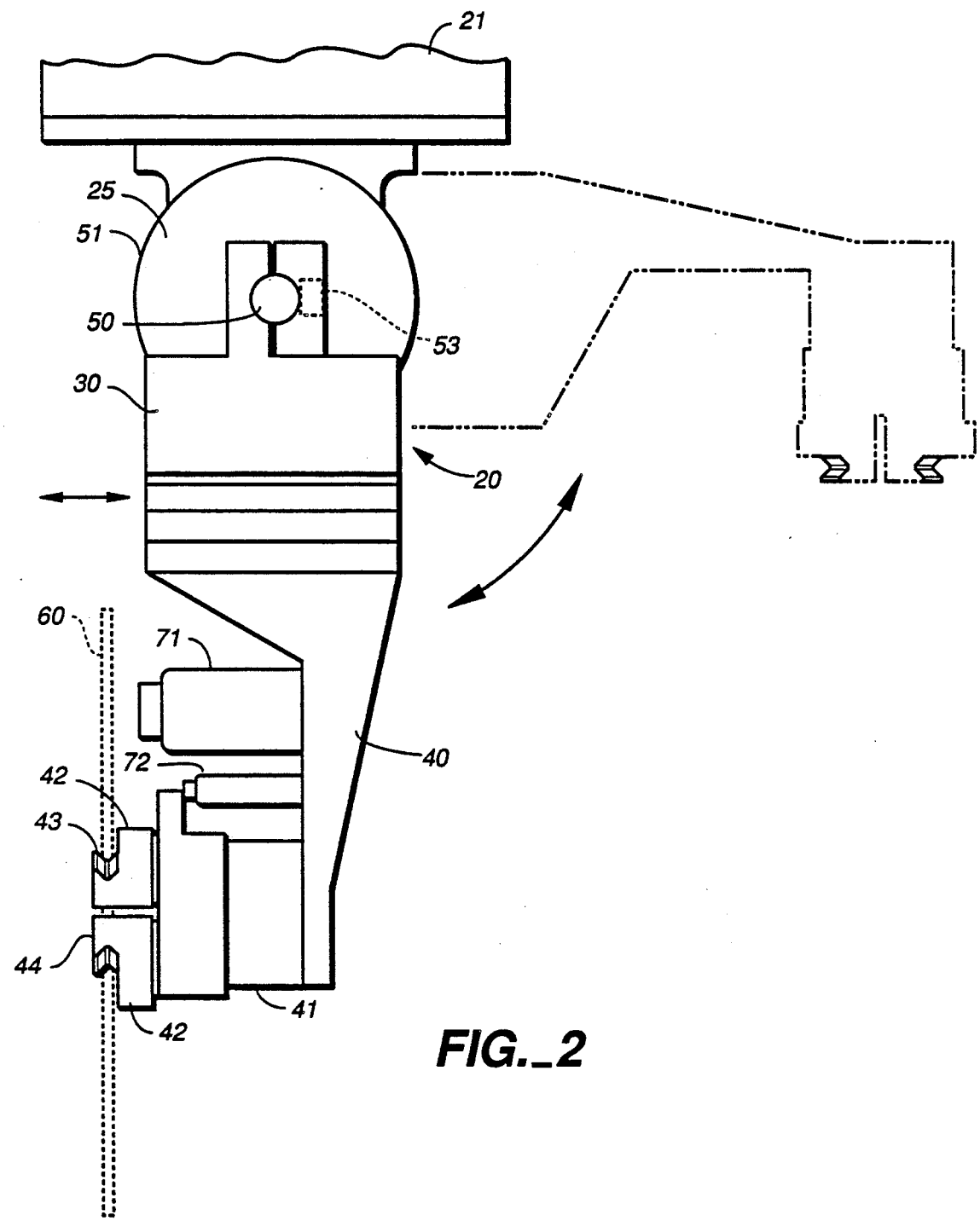
*FIG._2*

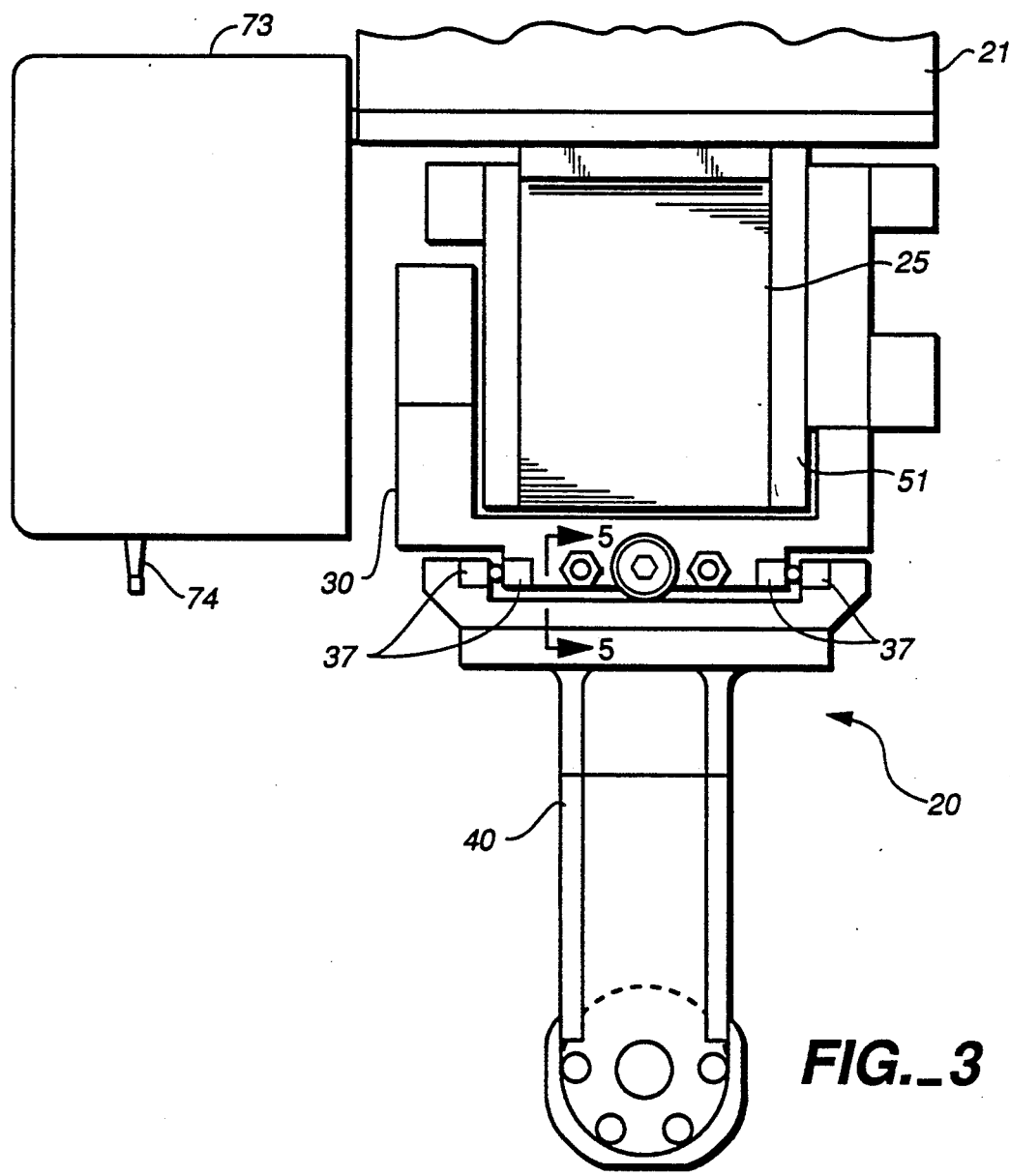
FIG._3
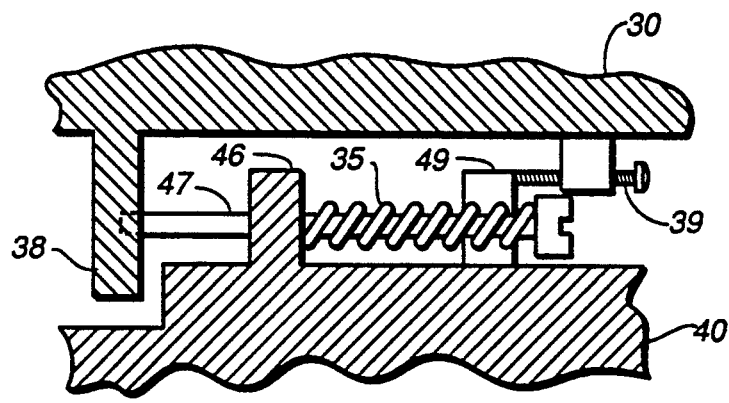
FIG._5

DISK GRIPPER FOR USE WITH A DISK POLISHER

BACKGROUND OF THE INVENTION

This invention relates to a disk gripper and, more particularly, to a device for gripping a disk such as a magnetic disk memory or a substrate of a semiconductor device lying on a horizontally disposed polishing sheet of a disk polisher.

Disks which are used as magnetic memory devices are generally circular with a circular center hole and of a uniform thickness except along their outer and inner edges. During their production process, they are usually transported from one work station to another in a cage-like cassette, standing up vertically therein and being kept parallel to and separated from one another. The device for polishing the surfaces of these disks may be referred to as a disk polisher and FIG. 1 shows an example of such a device characterized as having a polishing sheet 11 over a horizontal plate and a plurality (five according to the illustrated example) of circular carriers 12 placed on this polishing sheet 11. Each carrier 12 is formed as a gear wheel and has several (eight according to this example) circular holes 13 formed therethrough such that disks to be polished can be individually accommodated in these holes 13. These carriers 12 are enclosed inside a geared circular inner wall 14, individually engaging therewith, and there is a sun gear 15 at the center of this circular wall 14. The sun gear 15 is connected with a rotary power source such as a motor (not shown) and engages with each of the carriers 12 such that, as the sun gear 15 is rotated with the wall 14 fixed, the carriers 12 rotate around the sun gear 15 while rotating around their own central axes. If the holes 13 of the carriers 12 are filled with disks to be processed, these disks are pushed by the inner walls of the holes 13, sliding over the polishing sheet 11, as the carriers 12 undergo their rotary motions. The top surface of the polishing sheet 11 is preliminarily covered with a polishing agent containing water and the disks are thus polished as they slide over this surface. After one side of each disk is thus polished, the disks are picked up and turned over to have the other sides similarly polished.

After the disks are polished by means of a polisher of the type described above, the disks tend to get stuck with the top surface of the polishing sheet 11 and it is therefore not always easy to lift up the disks, for example, to collect them into a cassette to be transported to another work station. Since the disks used as substrates of semiconductor devices are fragile and easily contaminated, a robotically operated device capable of gripping and removing a disk is generally desirable but the polishing sheet 11 does not remain perfectly flat after a repeated use and the carriers do not always move in a perfectly horizontal plane. As a result, the individual disks to be removed from the disk polisher are not necessarily at the same height. This makes the operation very difficult for a conventional automated disk-handling device.

SUMMARY OF THE INVENTION

It is therefore a general object of the present invention to provide a disk gripper for use with a disk polisher of the type described above.

It is a specific object of the present invention to provide a disk gripper capable of gripping individual disks lying on a generally horizontal surface but not necessarily at exactly the same height.

It is another object of the present invention to provide such a disk gripper that is also capable of setting a disk onto a disk-carrying cassette of the conventional type.

The above and other objects of the present invention can be achieved by providing a disk gripper characterized as comprising a rotary actuator with a horizontally supported shaft, a swing arm which is attached to and can rotate with this shaft and a finger arm which is connected to the swing arm such that the longitudinally connected arms generally extend radially from the shaft and can assume both a horizontally extended position and a vertically extended position. The finger arm is provided with gripper fingers having mutually coplanar flat outer surfaces. When the arms are in the horizontally extended position, the gripper fingers protrude downward from the finger arm and these flat outer surfaces point downward. The gripper fingers are provided with grooves and are movable toward or away from one another while their flat outer surfaces slidingly move over the generally horizontal top surface of the polishing sheet such that a disk lying thereon can be engaged in these grooves or disengaged therefrom.

The swing arm and the finger arm are connected but slidable within a limited distance with respect to each other in a direction perpendicular to their extension. A spring is provided to apply a biasing force on the finger arm with respect to the swing arm such that, when the arms are in the horizontally extended position, the biasing force of the spring on the finger arm is in the downward direction. This serves to keep the flat outer surfaces of the gripper fingers pressed against the polishing sheet with a pressure within a prescribed range appropriate for squeezing the gripper fingers under the disk to be gripped without damaging the polishing sheet even if its top surface is not exactly even. When the arms are in the vertically extended position, this biasing force serves to keep the finger arm at a fixed position with respect to the swing arm such that the gripper fingers can be accurately brought, for example, to the position of a disk on a cassette.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIG. 1 is a plan view of a disk polisher for which a disk gripper according to the present invention is intended to be used, FIG. 2 is a side view of a disk gripper embodying the present invention when its swing arm and finger arm are in a vertically extended position, their horizontally extended position being shown by broken lines, FIG. 3 is a front view of the disk gripper shown in FIG. 2, FIG. 4 is a sectional view of the gripper fingers of the disk gripper of FIGS. 2 and 3 about to grip a disk placed horizontally on a disk polisher, and FIG. 5 is a schematic sectional view taken along the line 5—5 in FIG. 3 to show the connection between the swing arm and the finger arm of the disk gripper shown in FIGS. 2 and 3.

DETAILED DESCRIPTION OF THE INVENTION

With reference concurrently to FIGS. 2 and 3, numeral 20 generally indicates a disk gripper embodying the present invention for gripping a disk of an ordinary type serving as a substrate of a semiconductor device. This disk gripper 20 may be considered as a part of a robot (not shown entirely) for automatically transporting such disks between a cage-like disk-carrying cassette of a conventional type shown, for example, in U.S. Pat. No. 4,311,427 issued Jan. 12, 1982, U.S. Pat. No. 4,471,716 issued Sept. 18, 1984 and U.S. Pat. No. 4,493,418 issued Jan. 15, 1985 and a disk polisher of the type described above with reference to FIG. 1. Numeral 21 indicates a part of such a disk-handling robot to which the disk gripper 20 is attached.

Stated broadly, the disk gripper 20 is comprised of a rotary actuator 25, a swing arm 30 and a finger arm 40. The rotary actuator 25 with a substantially horizontally supported shaft 50 is contained inside an actuator housing 51 which is affixed to the robot main body 21 and the swing arm 30 is affixed to this shaft 50 by means of a clamp 53 so as to be able to rotate with this shaft 50. FIGS. 2 and 3 show the swing arm 30 in such a rotated position that it extends substantially vertically downward. By an operation of the actuator 25, the shaft 50 can be rotated such that the swing arm 30 assumes a substantially horizontal position shown approximately by broken lines in FIG. 2.

The finger arm 40 is connected to the swing arm 30 slidably in the direction of the double-headed arrow shown in FIG. 2 by a mechanism which will be described farther below. The finger arm 40 extends generally in the same radial direction (hereinafter referred to as the direction of the arms) as the swing arm 30 away from the shaft 50 and supports a finger actuator 41 near its end distal from the shaft 50. The finger actuator 41 is of a known kind and serves to move two gripper fingers 42 toward or away from each other in the direction of the arms such that these gripper fingers 42 can together engage and thereby grip a disk or disengage and thereby release the gripped disk. The disk gripper 20 shown in FIGS. 2 and 3 is for gripping a disk of a type having a circular inner hole at the center and is adapted to grip such a disk by engaging each of the gripper fingers 42 with the inner edge of the disk abutting the hole. For this purpose, each gripper finger 42 is formed with a groove 43 for engaging a disk and a flat outer surface 44 parallel to the direction of the arms as shown more clearly in FIG. 4 in which numeral 60 indicates a disk with a central hole, numeral 61 indicating its inner edge abutting the hole. Since the disk 60 is generally uniform in thickness but becomes gradually thinner along the inner edge 61 as shown in FIG. 4, each groove 43 is generally V-shaped, forming a sharply pointed nail 45 where the inner wall of the groove 43 borders upon the flat outer surface 44.

When it is desired to use the disk gripper 20 to remove a disk of the type described above from the disk polisher shown in FIG. 1 or, more specifically, to pick up a disk 60 lying substantially horizontally on top of the polishing sheet 11 of the polisher as shown in FIG. 4, the swing arm 30 is brought to its horizontally extended position such that, as shown in FIG. 2, the gripper fingers 42 protrude downward from the finger arm 40 and the flat outer surfaces 44 point downward. The gripper fingers 42 are moved toward each other as shown by broken lines in FIG. 4 and are placed at the center of the hole with the flat outer surfaces 44 in contact with the top surface of the polishing sheet 11. As the gripper fingers 42 are moved away from each other with their flat outer surfaces 44 sliding on the top surface of the polishing sheet 11 as shown by the arrows in FIG. 4, the pointed nails 45 crawl under the disk 60 and the inner edge 61 of the disk 60 engages the grooves 43 of the gripper fingers 42.

The mechanism by which the swing arm 30 and the finger arm 40 are connected to each other is explained next. As shown schematically in FIG. 5, a mounting piece 46 having a throughhole is attached to the finger arm 40 on its surface opposite to the swing arm 30. A member 47 shaped like a bolt with a head and a cylindrical part is affixed at the end of this cylindrical part distal from the head to a part (indicated by numeral 38) of the swing arm 30 protruding toward the finger arm 40 and penetrates the throughhole of the mounting piece 46 slidably therethrough. A normally compressed coil spring 35 is mounted around the cylindrical part of this member 47 with one of its ends affixed to the mounting piece 46 and its other end affixed to the head of the bolt-like member 47. As shown in FIG. 5, the surface of the finger arm 40 opposite the swing arm 30 is provided with a notch which is engageable with the aforementioned protruding part 38 so as to serve as a stopper for limiting the motion of the finger arm 40 to the left (in FIG. 5) with respect to the arm swing 30. In FIG. 5, numeral 49 indicates a part of the finger arm 40 protruding toward the swing arm 30 and numeral 39 indicates a set screw through another part of the swing arm 30 protruding toward the finger arm 40. This set screw 39, by contacting this protruding part 49, serves as another stopper for the finger arm 40 by limiting its motion to the right (in FIG. 5) with respect to the swing arm 30. The position of this set screw 39 with respect to the swing arm 30 can be controllably varied by rotating it such that the maximum distance by which the finger arm 40 can slide with respect to the swing arm 30 in the direction of the double-headed arrow in FIG. 2 can thus be controllably adjusted.

When the arms 30 and 40 are in the horizontally extended position and the gripper fingers 42 are placed on top of the horizontal surface of the polishing sheet 11, the flat outer surfaces 44 of the gripper fingers 42 are compressed against the polishing sheet 11 both by the weight of the finger arm 40 and by the biasing force of the normally compressed spring 35 independently of the actual height of the surface of the polishing sheet 11 at the point of contact. If the biasing force of the spring 35 is too weak, the weight of the arms 30 and 40 alone may not be sufficient large for the gripper fingers 42 to securely and dependably grip a target disk. If the biasing force is set too strong, on the other hand, the gripper fingers 42 may compress the upper surface of the polisher with an excessive downward force to damage the polishing sheet 11. In FIG. 3, numerals 37 each indicate a cross roller guide of a commercially available type having bearings. These guides 37 are provided such that the finger arm 40 can slide smoothly with respect to the swing arm 30 in the direction of the double-headed arrow shown in FIG. 2. When the arms 30 and 40 are in the vertically extended position for transferring a disk to or from a disk cassette, the spring 35 serves with its biasing force to keep the finger arm 40 at a fixed position with respect to the swing arm 30, enabling the disk gripper 20 to be accurately positioned with respect, for example, to a disk to be picked up from a cassette.

With reference to FIG. 2, the finger arm 40 is also provided with a magnetic sensor 71 for detecting the presence of a disk (shown at 60 by broken lines in FIG. 2) to be gripped by the gripper fingers 42 and another sensor 72 for detecting whether the gripper fingers 42 are in a closed position (moved toward each other) or in open position (moved away from each other). When the disk gripper 20 is used to grip a disk supported vertically by an ordinary cage-like cassette, the swing arm 30 and the finger arm 40 of the disk gripper 20 are positioned vertically as shown in FIG. 2 and the robot 21 is moved according to the output from the sensor 71 in order to position the gripper fingers 42 correctly with respect to the disk to be gripped.

In FIG. 3, numeral 73 indicates a touch sensor assembly (not shown in FIG. 2 for the sake of clarity) attached to the robot main body 21. A touch sensor 74, which may be of the type disclosed in U.S. Pat. No. 4,734,549, protrudes from the assembly 73 downward for determining the position of a disk disposed horizontally on the polishing sheet 11, or the position of the hole 13 containing the disk to be lifted. The robot 21 serves to move the disk gripper 20 appropriately in response to the positional information obtained by this touch sensor 74.

The foregoing description of a preferred embodiment of the invention has been presented for purposes of illustration and description. It is not intended to be exhaustive or to limit the invention to the precise form disclosed, and many modifications and variations are possible in light of the above teaching. For example, the number of the gripper fingers 42 is not limited to be 2. If the disks 60 to be picked up are small and, in particular, if the diameter of the holes at the center is very small, it is not easy to securely grip such a disk by engaging the gripper fingers with its inner edge. In such a case, it is preferable to grip the disk by its outer edge and the gripper fingers may be so designed that the grooves on different fingers face each other. It is also to be noted that FIG. 5 is drawn schematically for the purpose of describing the roles of various components of the mechanism for connecting the swing arm 30 and the finger arm 40. It is therefore not to be viewed as representing true positional relationships among these components. As for the sensors 71 and 72, they may be of a different type, depending on circumstances and also on the kind of disks to be handled.

In summary, the present invention provides a robotically operated disk gripper having an arm which can be rotated around a horizontal axis. The arm assumes a vertical position when a disk vertically supported on a conventional cage-like cassette is to be gripped or when a disk is to be deposited on such a cassette, and a horizontal position when a disk lying on a flat horizontal surface is to be gripped or a disk is to be deposited horizontally on such a surface. Sensors are provided for determining the position to which the disk gripper must be brought. The arm is comprised of two parts which are connected slidably with respect to each other in a direction perpendicular to their extension and a spring is provided where these two parts are connected such that, when the arm is in the horizontal position, the biasing force of the spring tends to compress gripper fingers onto the horizontal support surface on which lies a disk to be gripped. With a disk gripper thus structured, disks can be easily and dependably lifted away from a polisher surface even if the height of the individual disks being rotated thereon may not be uniform. Any modifications and variations that may be apparent to a person skilled in the art are intended to be included within the scope of this invention.

What is claimed is:

1. A disk gripper for gripping and transporting a disk, comprising:
   a rotatable shaft which is substantially horizontally supported,
   a swing arm which extends from said shaft in a radial direction and is rotatable with said shaft so as to be able to assume a horizontally extended position and a vertically extended position,
   a finger arm which is elongated in said radial direction and is connected to said swing arm slidably within a limited distance in a perpendicular direction to said radial direction such that said finger arm can slide vertically within said limited distance with respect to said swing arm when said swing arm is in said horizontally extended position,
   a biasing means for applying a biasing force on said finger arm in said perpendicular direction with respect to said swing arm, and
   a plurality of gripper fingers having mutually coplanar flat outer surfaces which are parallel to said radial direction, said gripper fingers being movable toward and away from one another parallel to said coplanar surfaces to thereby engage and disengage a disk to be gripped by said disk gripper.

2. The disk gripper of claim 1 wherein said biasing means is connected between said swing arm and said finger arm such that said biasing force on said finger arm is vertically downward when said swing arm and said finger arm are in said horizontally extended position.

3. The disk gripper of claim 1 wherein said biasing means includes a normally compressed spring.

4. The disk gripper of claim 1 further comprising sensors affixed to said finger arm for detecting the position of a disk to be gripped by said disk gripper.

5. The disk gripper of claim 1 wherein said coplanar flat surfaces are so formed as to face downward when said swing arm is in said horizontally extended position.

6. The disk gripper of claim 1 wherein said gripper fingers are formed with grooves each for engaging with an edge section of a disk to be gripped.

7. The disk gripper of claim 6 wherein said grooves are so positioned and oriented as to come to engage and to thereby grip a disk having an inner hole and lying on a horizontal support surface when said gripper fingers are moved away from one another with said mutually coplanar outer surfaces sliding on said horizontal support surface.

8. The disk gripper of claim 1 further comprising a finger actuator which is supported by said finger arm and serves to move said gripper fingers toward and away from one another.

9. The disk gripper of claim 1 further comprising a rotary actuator attached to said rotatable shaft for causing said swing arm to move between said vertically and horizontally extended positions.

10. The disk gripper of claim 1 wherein said limited distance is controllably variable.

* * * * *